United States Patent

Li et al.

Patent Number: 6,027,857
Date of Patent: Feb. 22, 2000

[54] NEGATIVE-ACTING NO-PROCESS PRINTING PLATES

[75] Inventors: Minyu Li, Oakdale; James P. Gardner, Stillwater; John E. Kluge, Woodbury; Sumita B. Mitra, West St. Paul, all of Minn.

[73] Assignee: Minnesota Mining and Manufacturing Company, St. Paul, Minn.

[21] Appl. No.: 09/301,502

[22] Filed: Apr. 28, 1999

Related U.S. Application Data

[62] Division of application No. 08/811,022, Mar. 4, 1997, Pat. No. 5,925,497, which is a division of application No. 08/582,459, Jan. 3, 1996, abandoned, which is a continuation-in-part of application No. 08/429,899, Apr. 27, 1995, abandoned.

[51] Int. Cl.[7] .............................. G03F 7/038; G03F 7/28; G03F 7/30
[52] U.S. Cl. ................................... 430/283.1; 430/285.1; 430/287.1; 522/149
[58] Field of Search .............................. 430/283.1, 285.1, 430/287.1; 522/149

[56] References Cited

U.S. PATENT DOCUMENTS

| | | | |
|---|---|---|---|
| 3,231,378 | 1/1966 | Silver | 96/33 |
| 3,285,745 | 11/1966 | Silver et al. | 96/90 |
| 3,357,831 | 12/1967 | Wu | 96/33 |
| 3,409,487 | 11/1968 | Fry et al. | 156/13 |
| 3,702,765 | 11/1972 | Laakso | 96/33 |
| 3,793,033 | 2/1974 | Mukherjee | 96/115 R |
| 3,825,430 | 7/1974 | Kurka | 96/115 R |
| 4,104,072 | 8/1978 | Golda et al. | 430/270.1 |
| 4,251,618 | 2/1981 | McCartin et al. | 430/270.1 |
| 4,263,394 | 4/1981 | Gates et al. | 430/287.1 |
| 4,517,218 | 5/1985 | Briney et al. | 430/322 |
| 4,600,679 | 7/1986 | Browne et al. | 430/162 |
| 4,874,686 | 10/1989 | Urabe et al. | 430/272.1 |
| 4,914,165 | 4/1990 | Klun et al. | 525/528 |
| 4,956,265 | 9/1990 | Klun et al. | 430/283.1 |
| 5,102,777 | 4/1992 | Lin et al. | 430/331 |
| 5,225,316 | 7/1993 | Vogel et al. | 430/270.1 |
| 5,235,015 | 8/1993 | Ali et al. | 528/304 |
| 5,240,808 | 8/1993 | Aoshima et al. | 430/175 |
| 5,258,263 | 11/1993 | Cheema et al. | 430/302 |
| 5,268,257 | 12/1993 | Mirle et al. | 430/285.1 |
| 5,296,334 | 3/1994 | Castaldi et al. | 430/280.1 |
| 5,314,785 | 5/1994 | Vogel et al. | 430/280.1 |
| 5,374,501 | 12/1994 | Holmes et al. | 430/273.1 |
| 5,407,764 | 4/1995 | Cheema et al. | 430/302 |
| 5,437,932 | 8/1995 | Ali et al. | 428/461 |
| 5,514,522 | 5/1996 | Fitzgerald et al. | 430/302 |
| 5,516,620 | 5/1996 | Cheng et al. | 430/138 |
| 5,556,924 | 9/1996 | Fitzgerald et al. | 430/284.1 |
| 5,561,029 | 10/1996 | Fitzgerald et al. | 430/281.1 |
| 5,599,650 | 2/1997 | Bi et al. | 430/273.1 |
| 5,607,816 | 3/1997 | Fitzgerald et al. | 430/271.1 |
| 5,616,449 | 4/1997 | Cheng et al. | 430/302 |
| 5,620,827 | 4/1997 | Cheng et al. | 430/138 |
| 5,677,108 | 10/1997 | Chia et al. | 430/302 |
| 5,677,110 | 10/1997 | Chia et al. | 430/273.1 |

FOREIGN PATENT DOCUMENTS

| | | |
|---|---|---|
| 0450199 | 10/1991 | European Pat. Off. . |
| 2171326 | 9/1973 | France . |
| 2253772 | 4/1975 | France . |
| 825948 | 12/1959 | United Kingdom . |
| 843543 | 8/1960 | United Kingdom . |
| 1153833 | 5/1969 | United Kingdom . |
| 1489402 | 10/1977 | United Kingdom . |
| 1489425 | 10/1977 | United Kingdom . |
| WO95/12837 | 5/1995 | WIPO . |
| WO97/12759 | 4/1997 | WIPO . |

OTHER PUBLICATIONS

Kirk–Othmer Encyclopedia of Chemical Technology, Third Edition, vol. 13, pp. 789–793 (1981).

*Primary Examiner*—Cynthia Hamilton

[57] ABSTRACT

A photosensitive composition is prepared containing a polymer of the formula B(X)(Y) wherein B represents an organic backbone, each X independently is an acidic group or salt thereof and each Y independently is a photocurable group and a photoinitiating compound or compounds. Preferably, free-radically polymerizable multi-functional monomer and/or oligomer is added to the photosensitive composition. The photosensitive composition can be coated on a suitable substrate for planographic printing plate applications. Imagewise irradiation causes the light struck regions to photocure, becoming insoluble in aqueous and organic mediums, while the non-light struck regions remain highly soluble/dispersable. Printing plates of this construction do not require processing prior to being run on a press.

11 Claims, No Drawings

NEGATIVE-ACTING NO-PROCESS PRINTING PLATES

This application is a division of Ser. No. 08/811,022, now U.S. Pat. No. 5,925,497, filed Mar. 4, 1997, which is a division of Ser. No. 08/582,459 filed Jan. 3, 1996, now abandoned, which is a continuation-in-part application of U.S. application Ser. No. 08/429,899, filed Apr. 27, 1995 now abandoned.

FIELD OF THE INVENTION

In one aspect, this invention relates to novel photosensitive compositions. In another aspect, this invention relates to negative-acting printing plates prepared from the novel photosensitive compositions. This invention further relates to a method of use for the novel printing plates that requires no further processing steps after exposure and prior to placing the printing plates on press.

BACKGROUND OF THE ART

The production of lithographic plates is well-known in the graphic arts industry. Lithographic processes generally employ at least two steps to prepare a plate for use in a printing press, namely exposure of a plate coated with a photosensitive composition to a light source through a mask (e.g., a positive or a negative mask), thus creating a photoimage, and a subsequent development step. Presensitized plates which are based on aluminum or polyester sheet-like material and are considered planographic in nature are commonly used in the industry. Typically, in a negative-acting system, the exposed areas become insolubilized (e.g., polymerized or crosslinked), and the development step involves washing material away from the unexposed portions of the plate. Conversely, in a positive-acting system, the development step involves washing material away from the exposed portions of the plate. The development step usually involves rinsing and washing with a developer solution and often is performed in a processing unit containing the developer solution. The developer solution generally is highly alkaline and often contains an organic solvent, such as benzyl alcohol. Alternatively, development of the photoimage has sometimes been accomplished by heating.

Both of the above-described (i.e., wet and thermal) development processes suffer from the drawback of being relatively time-consuming and expensive in some instances. Furthermore, when volatile organic or strongly alkaline solutions are employed as developer solutions, disposal of these solutions presents an environmental problem.

A printing plate which does not require processing prior to press would be desirable to the printing industry not only for environmental reasons, but also because it would reduce cost, reduce pressroom space, and decrease make-ready time. Because of these issues, the industry has long sought photosensitive compositions which do not have the above-described drawbacks. One method of overcoming these drawbacks is to provide a lithographic printing plate which does not require development or processing between imaging and being run on press. The term "no-process" as used herein refers to a printing plate which does not require any treatment, mechanical or chemical, between exposure and being run on press.

Constructions of positive-acting plates which do not require processing after imaging and before being run on press have been disclosed (e.g., see U.S. Pat. Nos. 20 5,102,771; 5,225,316 and 5,314,785). These patents disclose printing plates which are based on a photosensitive coating containing an ester of acrylic or methacrylic acid polymer and a photoacid-generating system. Upon imagewise exposure to actinic radiation, the polymer decomposes in the light struck regions, becoming fountain receptive, while areas in the non-light struck areas remain ink receptive.

Presensitized negative-acting lithographic plates which do not require processing after imaging and before being run on press are also known in the art. A category of plates which do not require processing between imaging and being run on press are described in U.S. Pat. Nos. 3,231,378; 3,285,745; and 3,409,487. These plates contain a photosensitive composition comprising a phenolic resin, an ethylene oxide polymer, and a photosensitizer. Upon exposure to actinic radiation, radicals are generated which cause the oxidation of the phenolic resin, thereby increasing the ink receptivity. A drawback of these plates is their tendency to become less ink receptive during the printing process. The loss of ink receptivity requires tight control of ink/water balance on press and, additionally, can cause the plates to become inoperable. U.S. Pat. No. 3,793,033 discloses the incorporation of hydroxyethylcellulose ether in the construction. The resultant plates did not suffer from blinding (i.e. loss of image on printing) and required less control of ink/water balance on press. A significant disadvantage of this construction is the use of phenolic resins which require curing to achieve suitable run lengths on press. The curing requirements necessitate a two layer system with the sensitizer applied on top of the phenolic-containing layer after the phenolic layer has been cured. If the sensitizer is not coated after curing, it can decompose during the cure step.

Another category of negative-acting plates which do not require processing between imaging and being placed on press are those based on multiple photosensitive layers. Typically, these constructions have a hydrophilic photosensitive layer nearest the substrate and an additional layer which is capable of photohardening in conjunction with the first layer, as described, for example in U.S. Pat. Nos. 4,600,679 and 4,104,072 and European Pat. Publ. No. 450, 199. Constructions such as these generally employ a negative-acting photosensitive composition based on aromatic diazo compounds as the hydrophilic layer closest to the substrate. A disadvantage is that these plates have a tendency to scum (i.e. take ink in the background areas) and also to contaminate the printing press. This drawback requires that plates first be washed with a suitable washing agent (i.e. fountain) prior to being run on press. Therefore, the incorporation of diazo compounds and resins is deleterious to the performance of plates intended for use as "no-process" plates. Printing plates are disclosed in PCT Application No. 93-05446 in which the diazo components have been eliminated from the hydrophilic layer, thus eliminating the problem of press contamination associated with residual unreacted diazo materials. The described plate is comprised of a plate/base substrate, a photosensitive polymeric hydrophilic layer nearest the base, and a separate photosensitive polymeric hydrophobic layer being next closest to the substrate. The photosensitive hydrophilic layer is based on polymerizable materials which do not contain diazo compounds. The functionality of the plate is derived from the insolubilization and hardening of both layers upon exposure to actinic radiation. This plate only requires a press equipped with ink and fountain to achieve good prints after exposure without the need to pre-wash the plate prior to being run on press. Because this construction has an external hydrophobic layer, it is impractical to achieve roll-ups equal to conventional plates without some treatment to remove the hydrophobic material from the background areas prior to being run on press.

It was against this background that the present invention dealing with negative-acting lithographic printing plates which require no further processing steps after exposure and prior to being placed on press was developed. These plates are prepared from a photosensitive composition comprising a reactive, acid functional polymer.

Reactive, acid functional polymers for a processed flexographic application have been disclosed in U.S. Pat. No. 5,268,257. In the preparation of flexographic printing plates, a relatively thick coating (typically 1–2 mm) of a flexible, photosensitive polymer is applied to a flexible substrate. During processing, a relief image is formed on the plate through exposure and wet development of the plate. The flexible, reactive, acid functional polymers disclosed in U.S. Pat. No. 5,268,257 are prepared by reacting a flexible carboxylated copolymer with a photosensitive vinyl containing compound, followed by an optional maleation reaction to increase the level of acid group functionality. Polymers prepared by this method result in a maximum acid group functionality of less than 0.37 ephr (equivalents per hundred gram of resin) and a maximum vinyl group functionality of less than 0.13 ephr.

SUMMARY OF THE INVENTION

The novel photosensitive composition of the present invention comprises:

(a) a reactive, acid functional polymer of the formula B(X)(Y), wherein B represents an organic backbone, each X independently is an acidic group or salt thereof present in an amount of between 0.02 and 0.8 ephr, and each Y independently is a photocurable group present in an amount of between 0.35 and 1.0 ephr; and (b) a photoinitiator which initiates crosslinking of the reactive, acid functional polymer upon exposure to radiation. It is emphasized that X can also represent the salt of an acid group generated through the addition of appropriate organic or inorganic base such as NaOH, $Na_2CO_3$, $(CH_3CH_2CH_2CH_2)_4N^+OH^-$, etc.

In a preferred embodiment, the photosensitive composition further comprises free-radically polymerizable multifunctional monomer and/or oligomer in order to increase the photospeed and durability of the photosensitive composition in printing plates and other applications.

In another embodiment of the present invention, a negative-acting printing plate is provided which comprises a substrate coated with a photosensitive composition comprising: (a) a reactive, acid functional polymer of the formula B(X)(Y), wherein B represents an organic backbone, each X independently is an acidic group or salt thereof and each Y independently is a photocurable group; and (b) a photoinitiator which initiates crosslinking of the reactive, acid functional polymer upon exposure to radiation, wherein X and Y are present in an amount sufficient to enable the printing plate to be placed directly on press after exposure with no additional processing steps being required.

In a further embodiment, the process of the invention involves the formation of an imaged article (e.g., printing plate) comprising the steps of: (a) exposing a negative-acting printing plate (as disclosed earlier herein) to radiation (e.g., within a range absorbed by a photoinitiator or sensitized photoinitiator present in the printing plate) to form a latent image-bearing article; (b) thereafter on press, applying a fountain solution to the latent image-bearing article; and (c) applying ink to the latent image-bearing article, thereby forming an imaged article. An alternative to the above process involves contacting the latent image-bearing article with a dye instead of ink to form an imaged article.

In an alternative embodiment, the process of the invention involves the formation of an imaged article (e.g., printing plate) comprising the steps of: (a) exposing a negative-acting printing plate (as disclosed earlier herein) to radiation (e.g., within a range absorbed by a photoinitiator or sensitized photoinitiator present in the printing plate) to form a latent image-bearing article; and (b) thereafter on press, applying an emulsion comprising fountain solution and ink to the latent image-bearing article, thereby forming an imaged article.

The photosensitive compositions of the present invention can be transparent or alternatively, translucent or opaque by the addition of suitable levels of opacifying pigment.

Preferred reactive, acid functional polymers of the present invention of formula B(X)(Y) are those in which each X is a carboxyl group or salt thereof and each Y contains an ethylenically-unsaturated group that can be polymerized by a free-radical mechanism. The number average molecular weight of the above polymers are preferably between about 1000 and 500,000, and more preferably, between about 2,000 and 50,000. The preferred level of polymerizable ethylenically-unsaturated groups Y in the above polymers is between 0.35 and 1.0 ephr, more preferably between 0.4 and 0.9 ephr, and most preferably between 0.45 and 0.8 ephr; and the preferred level of the acidic X group is between 0.02 and 0.8 ephr, more preferably between 0.05 and 0.6 ephr, and most preferably between 0.1 and 0.4 ephr.

Optionally, the photosensitive composition may also include a colorant and/or dye or dye/sensitizer system which upon exposure to light changes color. Additionally, the present photosensitive composition may contain various materials (e.g., stabilizers, surfactants, organic or inorganic beads, etc.) in combination with the essential ingredients of the present invention.

The construction of the negative-acting no-process printing plates of the present invention differs significantly from those known in the art. The construction of the present invention consists of a single photosensitive layer on a substrate. Additionally, the photosensitive layer does not contain phenolic resins or diazo/diazo based compounds. Finally, unlike conventional and flexographic printing plates, the plate of the present invention does not require any treatment after exposure prior to being run on press.

Other aspects, advantages, and benefits of the present invention are apparent from the detailed description, examples, and claims.

DETAILED DESCRIPTION OF THE INVENTION

The construction of the present invention comprises a photosensitive layer which further comprises a crosslinkable polymer and a photoinitiator which, upon exposure to radiation, initiates crosslinking of the polymer. Optionally, the photosensitive composition may also include a colorant and/or dye or dye/sensitizer system which upon exposure to light changes color. Additionally, the present photosensitive composition may contain various materials (e.g., stabilizers, surfactants, etc.) in combination with the essential ingredients of the present invention. Said photosensitive layer is coated on a suitable substrate.

Polymers of the photosensitive composition of this invention have the general formula B(X)(Y), wherein B represents an organic backbone, each X independently is an acidic group or salt thereof and each Y independently is a photocurable group. These polymers are similar in structure to those disclosed in U.S. Pat. No. 5,130,347 for use in filled dental cement containing reactive powders.

Preferably the backbone B is an oligomeric or polymeric backbone of carbon-carbon bonds, optionally containing non-interfering substituents such as oxygen, nitrogen or sulfur heteroatoms. The term "non-interfering" as used herein refers to substituents or linking groups which do not unduly interfere with the photocrosslinking reaction.

Preferred X groups are carboxyl groups and salts thereof Suitable Y groups include, but are not limited to, polymerizable ethylenically-unsaturated groups. Ethylenically-unsaturated groups are preferred, especially those that can be polymerized by means of a free-radical mechanism, examples of which are substituted- and unsubstituted-acrylates, methacrylates, alkenes and acrylamides. X and Y groups can be linked to the backbone B directly or by means of any non-interfering organic linking group, such as substituted or unsubstituted alkyl, alkoxyalkyl, aryl, aryloxyalkyl, alkoxyaryl, aralkyl, alkaryl, ester, or amide groups.

Preferred precursors to polymers of formula B(X)(Y) are polymers or copolymers having the structure B(X). The precursor polymers or copolymers B(X) suitable for this reaction are those which have a high amount of acid functionality, preferably 0.75–1.6 ephr. The term "ephr" refers to the equivalents of functional groups per 100 grams of resin (e.g., polymer B).

Photocrosslinkable polymers of formula B(X)(Y) can be prepared according to a variety of synthetic routes. The preferred method consists of reacting a polymer of formula B(X) with a suitable coupling compound in order to form pendent Y groups. Y groups are therefore incorporated by the use of a "coupling compound" (i.e. a compound containing both a Y group and a reactive group capable of reacting with the polymer through an X group). The product of the reaction between the coupling compound and the X group thereby links the Y group to the backbone in a pendent fashion. This reaction may take place with the evolution of a gas, such as $CO_2$. Suitable coupling compounds are organic compounds, optionally containing non-interfering substituents and/or non-interfering linking groups between the Y groups and the reactive group. Polymers of formula B(X)(Y) which are useful in this invention are those in which the level of polymerizable ethylenically-unsaturated groups Y is preferably between 0.35 and 1.0 ephr, more preferably between 0.4 and 0.9 ephr, and most preferably between 0.45 and 0.8 ephr; and the level of the acidic X group is preferably between 0.02 and 0.8 ephr, more preferably between 0.05 and 0.6 ephr, and most preferably between 0.1 and 0.4 ephr.

Preferred photocrosslinkable polymers of formula B(X)(Y) are those in which each X is a carboxyl group or salt thereof and each Y contains an ethylenically-unsaturated group that can be polymerized by a free-radical mechanism. Such polymers are conveniently prepared by reacting a polyalkenoic acid (e.g. polymers of the formula B(X), wherein each X is a carboxyl group or salt thereof) with a coupling compound containing both a polymerizable ethylenically-unsaturated group and a group capable of reacting with the carboxylic acid group. The number average molecular weight of the resultant photocrosslinkable polymer is preferably between 1000 and 500,000, and more preferably between 2,000 and 50,000. These polymers are generally water dispersable (e.g., soluble, swellable, etc.), but to a lesser extent than the polyalkenoic acids from which they are derived.

Suitable polyalkenoic acids for use in preparing the photocrosslinkable polymers of the present invention include homopolymers and copolymers of unsaturated mono-, di-, or tricarboxylic acids. Preferred polyalkenoic acids are those prepared by the polymerization and copolymerization of unsaturated aliphatic carboxylic acids, for example, acrylic acid, 2-chloroacrylic acid, 3-chloroacrylic acid, 2-bromoacrylic acid, 3-bromoacrylic acid, methacrylic acid, itaconic acid, glutaconic acid, aconitic acid, citraconic acid, mesaconic acid, fumaric acid, and tiglic acid. Suitable monomers which can be copolymerized with the unsaturated carboxylic acids include unsaturated aliphatic compounds, such as acrylamide, acrylonitrile, vinyl chloride, allyl chloride, vinyl acetate, and 2-hydroxyethyl methacrylate. Other monomers or comonomers that may be used include N-acryloyl or N-methacryloyl derivatives of amino acids. Examples of suitable amino acids are glycine; glycylglycine; alanine; valine; leucine; isoleucine; phenylalanine; tyrosine; proline; hydroxyproline; serine threonine; 3-amino-3-methylbutanoic acid; 6-aminocaproic acid; aminobenzoic acid (meta and para); 4-aminosalicylic acid; iminodiacetic acid; lanthionine; methionine; aspartic acid; glutamic acid; lysine; delta-aminolevulinic acid; beta-alanine; alpha-aminobutyric acid; gamma-aminobutyric acid; gamma, epsilon-diaminopimelic acid; alpha, gamma-diaminobutyric acid; ornithine; omega-aminododecanoic acid; beta-cyanoalanine; epsilon-methylhistidine; canavanine; jenkolic acid; 1-azaserine; gamma-methylene glutamic acid; N-methyl tyrosine; arginine; tryptophan; norvaline; cystine; cysteine; and hydroxylysine.

Particularly preferred polyalkenoic acids are the homopolymers and copolymers of acrylic, methacrylic, and itaconic acids. Polymers of the formula B(X) can thus be prepared by copolymerizing an appropriate mixture of monomers and/or comonomers. Preferably, the polymers are prepared by free-radical mechanism in solution, emulsion or interfacial methods. Such polymers can then be reacted with coupling compounds in the presence of catalysts as described below.

Coupling compounds suitable for use in preparing the preferred polymers of the present invention include compounds which contain at least one group capable of reacting with X in order to form a covalent bond, as well as at least one polymerizable ethylenically-unsaturated group. When X is carboxyl, a number of groups are capable of reacting with X, including both electrophilic and nucleophilic groups. Examples of such groups include the following moieties: —OH, —$NH_2$, —NCO, —COCl, and

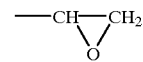

Examples of suitable coupling compounds include, but are not limited to, acryloyl chloride, methacryloyl chloride, vinyl azlactone, allyl isocyanate, 2-hydroxyethylmethacrylate, 2-aminoethylmethacrylate, and 2-isocyanatoethyl methacrylate. Other examples of suitable coupling compounds include those described in U.S. Pat. No. 4,035,321. Examples of preferred coupling compounds include, but are not limited to, the following methacrylates and their corresponding acrylates and allyl compounds.

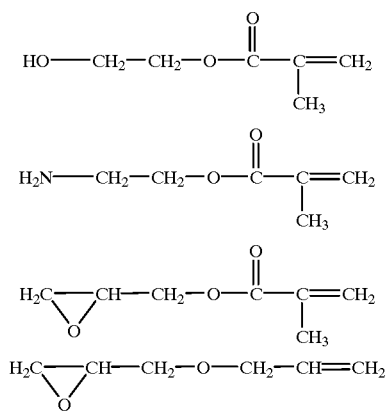

Particularly preferred coupling compounds are the following methacrylate, its acrylate analog and allyl compounds:

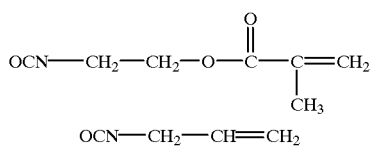

Preferred photocrosslinkable polymers of formula B(X)(Y) are prepared by reacting a polymer of formula B(X) wherein X is COOH with an isocyanate functional coupling compound. The resultant polymers of formula B(X)(Y) are then those where Yis linked to the X group by an amide linkage. Therefore, the amount (e.g., in ephr) of Y groups incorporated can be controlled by varying the equivalents of coupling compounds containing Y functional groups added to the polymer B(X). Thus, the composition of the photoactive polymer can be varied over a wide range. The preferred amount of Y groups in polymers of formula B(X)(Y) is 0.35–1.0 ephr, which can be calculated from the equivalents of coupling compounds reacted with polymer of formula B(X). The particularly preferred amount of Y groups is 0.45–0.8 ephr.

The polymer of the present invention may comprise between about 99.99% and 60% of the photosensitive layer. Preferably the polymer comprises between about 98% and 70% of the layer, more preferably between about 97% and 80% of the photosensitive layer.

In a preferred embodiment of the present invention, multifunctional monomers/oligomers are added to the photosensitive composition. Non-limiting examples of such monomers/oligomers are (meth)acrylic acid esters such as ethyl acrylate, butyl acrylate, allyl acrylate, multifunctional acrylates and methacrylates such as zinc diacrylate, 1,6-hexanediol diacrylate, pentaerythritol triacrylate and tetraacrylate, 1,3,5-tri-(2-acryloyloxyethyl)isocyanurate, propoxylated glyceryl triacrylate, ethoxylated trimethylolpropane triacrylate, polyethylene glycol dimethylacrylate, and derivatives of isocyanato containing ethylenically unsaturated compounds reacting with water, diols and polyols dicarboxylic acids and polycarboxylic acids. Examples of the isocyanato monomers are 2-isocyanatoethyl methacrylate and dimethyl-m-isopropenyl benzyl isocyanate. An example of the reaction of an isocyanatocontaining ethylenically unsaturated compound with water is the reaction product of 2-isocyanatoethyl methacrylate with water, 1,3-bis(2'—methyacryloxyethyl)urea (e.g., $CH_2$=$C(CH_3)$—$CO$—$OCH_2CH_2NH$—$CO$—$NHCH_2CH_2$—$CO$—$O$—$C(CH_3)$=$CH_2$.

When utilized, the total amount of multifunctional monomers/oligomers present in the photosensitive layer is from about 0.1 to about 90 wt % of the layer, more preferably between about 5 to 50 wt % of the layer.

The term "photoinitiator", as used herein, refers to any compound or combination of two or more components which upon exposure to electromagnetic radiation are capable of accelerating crosslinking of the above described polymers. The photoinitiator may be either a single compound or a combination of two or more components. Photoinitiators which initiate crosslinking due to the production of free-radicals upon exposure are preferred. Preferred photoinitiators are active when exposed to radiation between 200 and 1200 nm (e.g., ultraviolet, visible-light and infra-red radiation). Particularly preferred photoinitiators are active in the range of 300 to 850 nm.

Examples of suitable visible light- and ultraviolet-induced photoinitiators include, but are not limited to, ketones such as benzil and benzoin, and acyloins and acyloin ethers, for example 2,2,-dimethoxy-2-phenylacetophenone (Irgacure® 651), 2-benzyl-2-N,N-dimethylamino-1-(4-morpholinophenyl)-1-butanone (Irgacure®369) and benzoin methyl ether (2-methoxy-2-phenylacetophenone), all commercially available from Ciba-Geigy Corp.; sensitized diaryliodonium salts and triarylsulfonium salts (described, for example, in U.S. Pat. Nos. 3,729,313; 4,058,400; 4,058,401; 4,460,154; and 4,921,827). Suitable sensitizers for the diaryliodonium and trialrysulfonium salts are described in the foregoing patents. Preferred photoinitiators include chromophore-substituted halomethyl-1,3,5-triazine compounds, such as those described in U.S. Pat. Nos. 3,987,037; 4,476,215; 4,826,753; 4,619,998; 4,696,888; 4,772,534; 4,189,323; 4,837,128; and 5,364,734, and halomethyl oxadiazoles such as those described in U.S. Pat. No. 4,212,970. All such photoinitiators can be used alone or with suitable accelerators (e.g., amines, peroxides, and phosphorous compounds) and/or with suitable photosensitizers (e.g., ketone or alpha-diketone compounds such as camphorquinone).

The photoinitiator is preferably present in the construction of the present invention in an amount sufficient to achieve the desired extent of polymerization. Such amount is dependent on the efficiency of the photoinitiator and the thickness of the photoactive layer. Typically a photoinitiator will be present in an amount of about 0.01% to 20% by weight of the coating. The preferred amount of photoinitiator in the present invention is 0.5% to 15% by weight of the coating and a particularly preferred amount being between 0.5% to 10%.

An optional component of the lithoplate described in this invention is a colorant and/or dye or dye system. The visible image colorant and/or dye or dye system is not essential to the invention, however, it is generally desired to have a visible image after exposure and thus a colorant and/or dye or dye system may be added. Compounds or systems suitable for use are those which change color or hue upon exposure to actinic radiation or upon contact with the products from the exposed photoinitiator. Suitable compounds or systems include, but are not limited to leuco dyes, such as acyl protected thiazines, diazines and oxazines, hydrols (e.g., Michler's Hydrol), indolinenes and triarylmethane lactones (e.g., Crystal Violet Lactone). Preferred dyes used in the plate construction are substituted triarylmethane type leuco dyes. The dye is preferably present in the lithographic plate of the present invention in an amount sufficient to achieve the desired contrast between exposed and unexposed portions of the plate. Preferred levels of the dye are between 0 and 10% of the coating weight.

Additionally, the present photosensitive composition may contain various materials in combination with the essential ingredients of the present invention. For example, pigments, organic or inorganic beads, sensitizing dyes, plasticizers, binders, surfactants, antioxidants, coating aids, anti-static agents, waxes, ultra-violet or visible light absorbers and brighteners may be used without adversely affecting the practice of the invention.

Photosensitive compositions of the present invention are normally coated by means known in the art (e.g., knife coating, blade coating, bar coating, roll coating, extrusion coating, etc.) onto a substrate. The photosensitive composition is applied to the appropriate substrate at a coating weight of 0.01 g/m$^2$ (1 mg/ft$^2$) to 5.38 g/m$^2$ (500 mg/ft$^2$). Particularly preferred coating levels of the photosensitive layer are between 0.33 g/m$^2$ (30 mg/ft$^2$) and 1.94 g/m$^2$ (180 mg/ft$^2$).

Suitable substrates on which the photosensitive composition may be coated include but are not limited to, metals or metal alloys, for example steel and aluminum plates, sheets or foils including aluminum treated with hydrophilic agents, such as silicates or polyacrylic acid and its derivatives; films or plates composed of various film-forming synthetic or high polymers including addition polymers (e.g., poly(vinylidene chloride), poly(vinyl chloride), poly (vinyl acetate), polystyrene, polyisobutylene polymers and copolymers), and linear condensation polymers (e.g., poly (ethylene terephthalate), poly(hexamethylene adipate), poly (hexamethylene adipamide/adipate)); paper or paper laminates. Aluminum and aluminum alloys are preferred substrates. Aluminum or aluminum alloys which have been silicated are particularly preferred.

Additionally, it may be desired to apply an additional non-photoactive layer on top of the photosensitive layer. Examples of such layers include, but are not limited to polymers and laminated films, such as polyester.

The following non-limiting examples further illustrate the present invention.

EXAMPLES

Acrylic acid, itaconic acid, polyacrylic acid (MW=2,000), triphenyl antimony, dibutyl tin dilaurate, allyl isocyanate, and 3,5-di-t-butyl-4-hydroxytoluene (BHT) were obtained from Aldrich Chemical Co. (Milwaukee, Wis.) and used as such. Polyacrylic acid ("PAA") (mw=50,000) was obtained from Polysciences (Warrington, Pa.) in a 25% aqueous solution. The aqueous solution was dried to remove water and the solid residue was taken up and then precipitated from THF/ethyl acetate to obtain the solid material used in the examples below. The term "IEM" means 2-isocyanato ethyl methacrylate and was obtained from Showa Denka (Japan) and Polysciences (Warrington, Pa.) and used as such. The term BHT means 3,5-di-t-butyl-4-hydroxytoluene. The term AIBN means 1,1'-azobis (isobutyronitrile) (available from Kodak and DuPont). The term "MOSTOL" means 2,4-bis trichloromethyl-6-[p-(2-hydroxyethoxy)styryl-1,3,5-triazine] as described in U.S. Pat. No. 4,476,215. The term "XL Leuco" means [bis(4-dimethylamino-2-methylphenyl)-4-dimethylaminophenyl] methane which was prepared in a manner similar to the general method described in Fr. Pat. No. 1,406,247. KC-4 is the amino ketone substituted coumarin sensitizer:

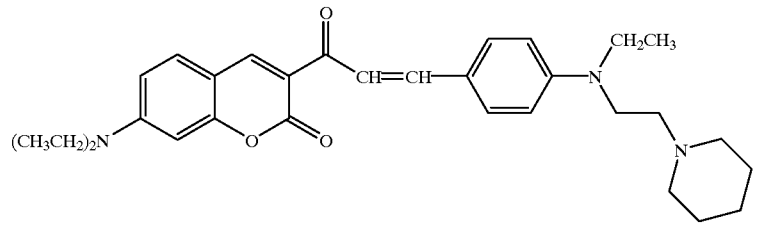

which was prepared as described in European Pat. Publ. No. 538,997. The term IPA means isopropyl alcohol or isopropanol. The term THF means tetrahydrofuran.

Materials were analyzed by one or more of the following techniques: $^1$H NMR, infrared, and mass spectroscopy; gel phase chromatography; and differential scanning calorimetry. Aluminum substrates used for coatings in the following experiments were cleaned, degreased lithograde alloy, electrochemically grained, anodized and silicated aluminum sheets. Exposures were conducted using either a Berkey Ascor vacuum frame exposure unit (Berkey Technical Co., Woodside, N.Y.; equipped with either an Addalux Lamp No. 1406-01 or an Addalux Supercharged 5 kW Triplespectrum Lamp No. 754-18017) or a Burgess vacuum frame (Burgess Industries, Minneapolis, Minn., equipped with a 5 kW Triplespectrum Metal Halide Lamp). A neutral density 21 step (0.15 absorbance units/step) sensitivity guide (Stouffer Graphic Arts Equipment Co., South Bend, Ind.) was used to measure the photosensitivity of the coatings prepared below.

The term solid step as used below refers to the highest numbered step which is completely inked after the imaged plate is run on press or hand inked. The term open step refers to the highest numbered step which is completely free of ink after the imaged plate is run on press or hand inked. Press results were obtained using either a Ryobi 3200 ACD, a Heidelberg SORMZ, a Harris LTV or a Didde Apollo press. The presses were equipped with Viking® Fountain with IPA or suitable alcohol replacement. An additional method used to identify the printability of the plates was hand inking using Rub-Up™ Ink U-62 (Printing Development, Inc., Racine, Wis.).

Examples 1

This example describes the preparation of a copolymer of acrylic acid and itaconic acid wherein the molar ratio of acrylic acid to itaconic acid is 3:1.

A glass reactor equipped with an addition funnel, a reflux condenser and a dry nitrogen air inlet tube was charged with 150 mL dry THF (water content <0.005%) and 13.0 g of itaconic acid (0.10 mol). The reaction vessel was kept under an atmosphere of nitrogen throughout the procedure. The mixture was stirred and the acid dissolved after several minutes. A solution of acrylic acid (21.6 g, 0.30 mol) in 35 mL of THF was then added to the reactor. A solution of AIBN in dry THF was then added to the stirring reaction mixture such that 2% by weight based on the total weight of the monomers of AIBN was added. The reaction was maintained at room temperature for 30 min and then refluxed for 18 hr resulting in a homogeneous, slightly hazy solution. When a drop of the reaction mixture was added into several mL of ethyl acetate, precipitation of a white polymer was observed. The polymer was calculated to have 1.45 ephr acid functionality.

Examples 2

This example describes the reaction of a copolymer of acrylic acid and itaconic acid (3:1 molar ratio) with IEM wherein the molar ratio of IEM to acid groups in the copolymer 0.8:1.

The resultant solution of Example 1 was maintained at a bath temperature of about 40–50° C. under an atmosphere of dry air. A solution containing 0.4 g BHT, 0.4 g triphenylantimony, and 3.4 g dibutyltin dilaurate in 20 mL of dry THF was slowly added to the stirring copolymer solution. IEM (55.6 g, 0.4 mol) was then added dropwise to the mixture over a period of approximately 1 hr. After the IEM addition was complete, the reaction solution was stirred for approximately 18 hr at a bath temperature of approximately 40–50° C. until the evolution of carbon dioxide ceased and the solution became homogeneous. Infrared spectral analysis showed the absence of the NCO band at about 2300 cm$^{-1}$. A white polymer was precipitated by the slow addition of the reaction mixture which had been previously diluted with three times its volume of ethyl acetate to hexanes. After precipitation a white solid was isolated and dried under vacuum. The yield of the polymer was approximately 96%.

The polymer was calculated to have 0.14 ephr acid finctionality and 0.55 ephr polymerizable ethylenically-unsaturated functionality.

Example 3 (Comparative Example)

A copolymer of acrylic acid and itaconic acid was prepared as in Example 1 except that the molar ratio of acrylic acid to itaconic acid was 4:1. The polymer was calculated to have 1.44 ephr acid functionality. The resulting polymer was reacted with IEM as described in Example 2, except that the molar ratio of IEM to acid groups was 0.16:1. The resulting polymer was isolated by precipitation from ethyl acetate. The polymer was calculated to have 0.96 ephr acid functionality and 0.18 ephr polymerizable ethylenically-unsaturated functionality.

Examples 4–6

These examples describe the reaction of polyacrylic acid (mw=2,000, calculated 1.39 ephr acid functionality) with IEM wherein the molar ratio of IEM to acid groups ranges from 0.5:1 to 0.8:1.

A glass reactor was equipped with an addition funnel, a reflux condenser, a dry air inlet tube and 75 mL of dry THF (water content <0.005%). Polyacrylic acid (mw=2,000, 8.64 g, 0.12 mol acid groups) was added to the flask. After stirring at a bath temperature of 50–70° C. for 2–3 hr, a cloudy solution was obtained. The temperature of the bath was maintained at 40–50° C. and a solution containing 0.093 g BHT, 0.093 g triphenylantimony, and 0.64 g dibutyltin dilaurate in 5 mL of dry THF was slowly added to the stirring polymer solution. IEM then was added dropwise to the mixture over a period of 0.5–1.5 hr. The amount of IEM added for each example is listed in Table I. After adding the IEM, the mixture was stirred continuously overnight. The completion of the reaction was monitored by the disappearance of NCO band around 2300 cm$^{-1}$. White solid polymers were obtained by precipitation with the solvent indicated. After isolation, the white solids were dried under vacuum. The solvents used for precipitation and the yields of the polymers isolated are reported in Table I.

TABLE I

| Example | IEM, g | IEM, mole | Molar Ratio IEM:Acid | Precipitation Solvents | Acid, ephr | Unsat., ephr | Polymer Yield |
|---|---|---|---|---|---|---|---|
| 4 | 14.9 | 0.096 | 0.8:1 | Hexane | 0.12 | 0.50 | 90% |
| 5 | 12.1 | 0.078 | 0.65:1 | Petroleum Ether | 0.24 | 0.45 | 92% |
| 6 | 9.3 | 0.060 | 0.5:1 | Petroleum Ether | 0.39 | 0.39 | 90% |

Examples 7–8

These examples describe the reaction of polyacrylic acid (mw=50,000, calculated 1.39 ephr acid functionality) with IEM wherein the molar ratio of IEM to acid groups is 0.5:1 and 0.8: 1.

A glass reactor was equipped with an addition funnel, a reflux condenser, a dry air inlet tube and 75 mL of dry THF (water content <0.005%). Polyacrylic acid (mw=50,000, 8.64 g, 0.12 mol acid groups) was added to the flask. After stirring at a bath temperature of 50–70° C. for 2–3 hr, a cloudy solution was obtained. The temperature of the bath was maintained at 40–50° C. and a solution containing 0.093 g BHT, 0.093 g triphenylantimony, and 0.64 g dibutyltin dilaurate in 5 mL of dry THF was slowly added to the stirring polymer solution. THF then was added dropwise to the mixture over a period of 0.5 hr. The amount of IEM added for each example is listed in Table II. After adding the IEM, the mixture was stirred continuously overnight. The completion of the reaction was monitored by the disappearance of NCO band around 2300 cm$^{-1}$. White solid polymers were obtained by precipitation with the solvents indicated. After isolation, the white solids were dried under vacuum. The solvents used for precipitation and the yields of the polymers isolated are reported in Table II.

TABLE II

| Example | IEM, g | IEM, mole | Molar Ratio IEM:Acid | Precipitation Solvents | Acid, ephr | Unsat., ephr | Polymer Yield |
|---|---|---|---|---|---|---|---|
| 7 | 14.9 | 0.096 | 0.8:1 | Hexane/Ethyl Acetate (5:1) | 0.12 | 0.50 | 85% |
| 8 | 9.3 | 0.060 | 0.5:1 | Ethyl Acetate | 0.39 | 0.39 | 80% |

Example 9

This example describes the reaction of polyacrylic acid (mw=2,000, calculated 1.39 ephr acid functionality) with allyl isocyanate wherein the molar ratio of allyl isocyanate to acid groups is 0.8: 1.

A glass reactor was equipped with an addition funnel, a reflux condenser and a dry air inlet tube and 50 mL of dry THF (water content <0.005%). Polyacrylic acid (mw=2,000, 8.64 g, 0.12 mol acid groups) was added to the flask. ARer stirring at a bath temperature of 60° C. for 1 hr, a cloudy solution was obtained. The temperature of the bath was maintained at 40–50° C. and a solution containing 0.093 g BHT, 0.093 g triphenylantimony, and 0.64 g dibutyltin dilaurate in 2 mL of dry THF was slowly added to the stirring polymer solution. A solution of allyl isocyanate (8.0 g, 0.096 mol) in 8 mL of THF then was added over a period of 30 min. The reaction solution was stirred continuously overnight and became clear brown in color. The completion of the reaction was monitored with the disappearance of NCO band around 2300 $cm^{-1}$. The viscous solution was diluted with THF and precipitated with a 1:3 mixture of hexanes/ethyl acetate. A fine white powder was isolated and dried giving a polymer yield of 48%. The polymer was calculated to have 0.19 ephr acid functionality and 0.77 ephr polymerizable ethylenically-unsaturated functionality.

Example 10

This example describes the preparation of polyacrylic acid (calculated 1.39 ephr acid functionality) and subsequent reaction with IEM wherein the ratio of IEM to acid groups is 0.8:1.

A glass reactor was equipped with an addition funnel, a reflux condenser and a gas inlet tube. The reaction vessel was purged with dry nitrogen and then charged with 70 mL of dry THF (water content <0.005%) and acrylic acid (7.2 g, 0.10 mol). The reaction solution was maintained under an atmosphere of nitrogen. After stirring for 30 min, a solution of 0.029 g AIBN in 5 mL of THF was added to the reaction solution. The solution was heated to and maintained at a bath temperature of 65° C. overnight. After stirring overnight, the reaction solution was placed under an atmosphere of dry air and the temperature of the bath was maintained at 40–50° C. A solution containing 0.10 g BHT, 0.10 g triphenylantimony, and 0.850 g dibutyltin dilaurate in 5 mL of dry THF was slowly added to the stirring polymer solution. IEM (12.41 g, 0.08 mol) was then added dropwise to the mixture over a period of 0.5 hr. After adding the IEM, the mixture was stirred continuously overnight. The completion of the reaction was monitored by the disappearance of NCO band around 2300 $cm^{-1}$. A white polymer was precipitated by the addition of the reaction mixture which had been previously diluted with three times its volume of ethyl acetate to hexanes. After precipitation, the white solid was dried under vacuum. The polymer was calculated to have 0.12 ephr acid functionality and 0.50 ephr polymerizable ethylenically-unsaturated functionality.

Example 11

This example describes the preparation of a printing plate with material from Example 9.

A coating solution containing 1.06 g of the solid product of Example 9, 0.072 g MOSTOL, 0.072 g XL Leuco, and 8.8 g 1-methoxy-2-propanol (Dowanol PM) was prepared. The solution was coated on an electrochemically grained, anodized and silicated aluminum substrate using a #6 wire wrapped rod (R&D Specialties, Webster, N.Y.). The plate was dried with a heat gun and exposed through a negative film in a Berkey Ascor vacuum frame for 70 sec. After exposure, the plate was hand inked using rub up ink and Viking® fountain with 10 % IPA. The exposed areas of the plate accepted ink and unexposed areas excluded ink. A solid step 4 on the Stouffer gray scale was observed for the inked plate.

Examples 12–15

These examples describe the preparation of printing plates with materials from Examples 2, 4, 7 and 8. Solutions were prepared according to Table III.

TABLE III

| Example | Polymer | Amt of Polymer | MOSTOL | XL Leuco | Dowanol PM |
|---|---|---|---|---|---|
| 12 | Example 4 | 1.056 g | 0.072 g | 0.072 g | 8.8 g |
| 13 | Example 7 | 1.056 g | 0.072 g | 0.072 g | 8.8 g |
| 14 | Example 8 | 1.056 g | 0.072 g | 0.072 g | 8.8 g |
| 15 | Example 2 | 1.056 g | 0.072 g | 0.072 g | 8.8 g |

The solutions were coated on an electrochemically grained, anodized and silicated aluminum substrate using a #6 wire wrapped rod (R&D Specialties, Webster, N.Y.). The plates were then dried for 2 min at 75° C. The plates then were exposed through a negative film in a Burgess vacuum frame for 24 units. The plates were mounted on an Apollo press equipped with Kohl Madden, T81-7015 ink (tack 12) and Viking® fountain with 10% IPA under yellow lights. The press was then started and the printed solid steps, the speed of the roll-up, and the number of impressions printed before the samples were removed from the press were recorded. Roll-up as used herein is defined as the number of impressions before a clean copy (i.e. fully inked image and fully clean background) is obtained. A roll-up which is termed "fast" is generally equivalent to the roll-up observed on a processed conventional plate. The data is summarized in Table IV.

TABLE IV

| Example | Roll-up | 1st Solid Step | Impressions printed |
|---|---|---|---|
| 12 | Fast | 10 | 60,000 |
| 13 | Fast | 10 | 40,000 |
| 14 | Fast | 6 | 40,000 |
| 15 | Fast | 11 | 60,000 |

Example 16

This example describes the preparation of a printing plate prepared using material from Example 10.

A coating solution containing 0.470 g of the solid product of Example 10, 0.030 g, Irgacure® 369 (Ciba-Geigy), and 4.5 g 1-methoxy-2-propanol (Dowanol PM) was prepared. The solution was coated on an electrochemically grained, anodized and silicated aluminum substrate using a #6 wire wrapped rod (R&D Specialties, Webster, N.Y.). The plate was dried with a heat gun and exposed through a negative film in a Berkey Ascor vacuum frame for 70 sec. After exposure, the plate was hand inked using rub up ink and Viking® fountain with 10% IPA. The exposed areas of the plate accepted ink and the unexposed areas excluded ink.

Examples 17–19

These examples describes the preparation of a printing plate suitable for imaging with 488 and 532 nm light and prepared with material from Example 4.

A coating solution containing 0.820 g of the solid product of Example 4, 0.020 g KC-4, 0.160 g diphenyliodonium hexafluorophosphate, and 9.0 g 1-methoxy-2-propanol (Dowanol PM) was prepared. The solution was coated on an electrochemically grained, anodized and silicated aluminum substrate using a #6 wire wrapped rod (R&D Specialties, Webster, N.Y.). The plate was dried with a heat gun and exposed through a negative film with a 3M Model 70 exposure unit equipped with a tungsten lamp. Several light filters were used to determine the response of the plate to various wavelengths of light. The exposure conditions and the printability are summarized in Table V. Printability is used to describe a plate which takes ink in the imaged areas and excludes ink from the non-imaged areas. Printability was determined by hand inking the exposed plates with rub up ink and Viking® fountain with 10% IPA.

TABLE V

| Example | Filter | Exposure (units) | Printability |
| --- | --- | --- | --- |
| 17 | None | 2 | Good |
| 18 | 532 nm band pass | 120 | Good |
| 19 | 488 nm band pass | 120 | Good |

Example 20

This example describes the preparation of a printing plate prepared using polymer from Example 2 and a pigment.

A coating solution containing 124.5 g of a polymer prepared in a similar fashion to Example 2, 9.0 g MOSTOL, 9.0 g XL Leuco, 32.6 g magenta millbase pigment (23% solids, prepared as described in copending U.S. patent application Ser. No. 08/402,628, filed Mar. 15, 1995), and 1324.9 g 1-methoxy-2-propanol (Dowanol PM) was prepared. The solution was coated by extrusion on an electrochemically grained, anodized and silicated aluminum substrate at a coating weight of 129 g/m$^2$ (120 mg/ft$^2$).

One plate of this example was exposed through a negative film in a Burgess vacuum frame for 24 units. After exposure the plate was mounted on a Heidelberg SORMZ press equipped with Viking® fountain with 10% IPA and INX Inc. o/s Riegel 2 Process™ Black ink. The exposed area started to accept ink after 2 impressions the unexposed area showed a clean background after 200 impressions.

Another plate of this example was exposed through a negative film in a Burgess vacuum frame for 12 units. After exposure the plate was processed in a 3M 1132 processor equipped with Viking® plate developer. The processed plate was mounted on a Harris press equipped with Kohl Madden, MSP-61235-A ink and Viking® fountain with 25% IPA. The plate gave a good roll-up and printed greater than 10,000 impressions.

Example 21

This example describes the preparation of a printing plate prepared using polymer from Example 2.

A coating solution containing 0.2 g of a polymer prepared in a similar fashion to Example 2, 0.014 g MOSTOL, 0.014 g Pergascript Turquoise (Ciba-Geigy), and 1.76 g 1-methoxy-2-propanol (Dowanol PM) was prepared. The solution was coated on an electrochemically grained, anodized and silicated aluminum substrate using a #6 wire wrapped rod (R&D Specialties, Webster, N.Y.). The plate was dried with a heat gun and exposed through a negative film in a Berkey Ascor vacuum frame for 1 minute. After exposure, the plate was hand inked using rub up ink and Viking® fountain with 10% IPA. The exposed areas of the plate accepted ink and the unexposed areas excluded ink.

Example 22 (Comparative Example)

This example describes the preparation of a printing plate prepared using polymer from Example 3.

A coating solution containing 1.056 g of the polymer of Example 3, 0.072 g MOSTOL, 0.072 g XL-leuco, and 8.8 g 1-methoxy-2-propanol (Dowanol PM) was prepared. The solution was coated on an electrochemically grained, anodized and silicated aluminum substrate using a #6 wire wrapped rod (R&D Specialties, Webster, N.Y.). The plate was dried with a heat gun and exposed through a negative film in a Berkey Ascor vacuum frame for 70 seconds. After exposure, the plate was hand inked using rub up ink and Viking® fountain with 10% IPA. No solid step was obtained. The ink receptivity of the exposed area was poor.

Example 23

This example describes the preparation of a printing plate prepared using polymer from Example 6.

A coating solution containing 1.056 g of the polymer of Example 6, 0.072 g MOSTOL, 0.072 g XL-leuco, and 8.8 g 1-methoxy-2-propanol (Dowanol PM) was prepared. The solution was coated on an electrochemically grained, anodized and silicated aluminum substrate using a #6 wire wrapped rod (R&D Specialties, Webster, N.Y.). The plate was dried with a heat gun and exposed through a negative film in a Berkey Ascor vacuum frame for 70 seconds. After exposure, the plate was hand inked using rub up ink and Viking® fountain with 10% IPA. The exposed area accepted ink well and eight solid steps were obtained.

Example 24

The following coating solutions were prepared:

| Component | A | B |
| --- | --- | --- |
| PAA (polymerized in 0.4% AIBN)-IEM (80%) | 0.88 g (100%) | 1.80 g (90%) |
| MOSTOL | | 0.080 g (4%) |
| XL LEUCO | | 0.120 g (6%) |
| Dowanol PM | 9.1 g | 18.0 g |

C: To 4.0 g of B was added 0.018 g of tetramethylammonium hydroxide pentahydrate (5% of the polymer).

D: To 3.0 g of A was added 0.015 g of tetramethylammonium hydroxide pentahydrate (5% of the polymer).

The solutions were coated on 16M base with #6 meyer rod. The coating was dried by blowing a hot air gun over it for a few seconds. The plates were aged at 60° C. for 0, 1, 2, and 3 days. After the aging, the plate was exposed in a Berkey Ascor vacuum frame for 70 sec. then inked with VIKING® fountain. The results were as follows:

|   | fresh | | 1 day | | 2 days | | 3 days | |
| --- | --- | --- | --- | --- | --- | --- | --- | --- |
|   | Image | Backg'd | Image | Backg'd | Image | Backg'd | Image | Backg'd |
| A | no | clean | no | clean | no | clean | no | clean |
| B | 9 f.s.st. | clean | NA* | scummed | NA | scummed | NA | scummed |
| C | 6 f.s.st. | clean | 6 f.s.st. | clean | 6 f.s.st. | clean | 7 f.s.st. | clean |
| D | no | clean | no | clean | no | clean | no | clean | f.s.st.: first solid step
Backg'd: background
*not readable due to the scumming

Example 25

The following solutions were prepared:

| Component | A (standard) | B–G |
| --- | --- | --- |
| PAA (polymerized with 2% AIBN)-IEM (70%) | 85% of total solid | 75% |
| MOSTOL | 4% | 4% |
| XL LEUCO | 6% | 6% |
| tetramethylammonium hydroxide pentahydrate | 5% | 5% |
| multifunctional monomers* | 0% | 10% |
| Dowanol PM | 10% solid content | 10% solid content |

*multifunctional monomers/oligomers were as follows:
B: ethoxylated trimethyolpropane triacrylate (SR454)
C: propoxylated trimethyolpropane triacrylate (SR492)
D: ethoxylated trimethyolpropane triacrylate (SR9035)
E: propoxylated glyceryl triacrylate (SR9020)
F: polyethylene glycol 100 - dimethylacrylate
G: polyethylene glycol 1000 - dimethylacrylate The solutions were coated on EC grained, anodized and silicated base with #6 meyer rod. The coating was dried at 80° C./2 min. The plates were exposed to Berkey Ascor for 10 units then run on a press without any previous wet development. All the plates were quickly rolled up with a high contrast image and a clean background. The relative press-life of the plates compared with the standard plate (A) is listed below.

|   | A | B | C | D | E | F | G |
| --- | --- | --- | --- | --- | --- | --- | --- |
| Δ (1st solid step)* | 0 | +1 | +1 | +1 | +1 | +2 | +2 |
| relative press-life** | 100% | 250% | 150% | 150% | 250% | 100% | 50% |

*Δ (1st solid step) = (# of the 1st solid step on print sheet after 100 impressions) − (# of the 1st solid step on print sheet after 100 impressions of A)
**relative press-life = (# of impressions of the experimental plate/# of impressions of A) × 100%

Reasonable variations and modifications are possible from the foregoing disclosure without departing from either the spirit or scope of the present invention.

We claim:

1. A photosensitive composition comprising: (a) a reactive, acid functional polymer of the formula B(X)(Y), prepared by reacting a polyalkenoic acid homopolymer having acidic groups present in an amount between 0.75 and 1.6 ephr with a coupling compound selected from the group consisting of allyl isocyanate and 2-isocyanatoethylmethacrylate, wherein B represents an organic backbone of carbon-carbon bonds, each X independently is a salt of said acidic group present in an amount of between 0.02 and 0.8 ephr, and each Y independently is a photocurable group present in an amount of between 0.35 and 1.0 ephr; and (b) a photoinitiator which initiates crosslinking of the reactive acid functional polymer upon exposure to radiation.

2. The photosensitive composition of claim 1 wherein said photoinitiator generates free-radicals upon exposure to radiation.

3. The photosensitive composition of claim 2 wherein said photoinitiator generates free-radicals upon exposure to radiation between 300 and 850 nm.

4. The photosensitive composition of claim 2 wherein said photoinitiator is selected from the group consisting of onium salts and photolyzable organic halogen compounds.

5. The photosensitive composition of claim 1 wherein X is a salt of a carboxyl group.

6. The photosensitive composition of claim 1 wherein X is present in an amount of between 0.05 and 0.6 ephr, and Y is present in an amount of between 0.4 and 0.9 ephr.

7. The photosensitive composition of claim 1 wherein X is present in an amount of between 0.1 and 0.4 ephr and Y is present in an amount of between 0.45 and 0.8 ephr.

8. The photosensitive composition according to claim 1 wherein said composition further comprises free-radically polymerizable multi-functional monomer and/or oligomer.

9. The photosensitive composition of claim 1 wherein said polyalkenoic acid homopolymer is a homopolymer of an unsaturated aliphatic carboxylic acid.

10. The photosensitive composition of claim 9 wherein said unsaturated aliphatic carboxylic acid is selected from the group consisting of acrylic acid, 2-chloroacrylic acid, 3-chloroacrylic acid, 2-bromoacrylic acid, 3-bromoacrylic acid, methacrylic acid, itaconic acid, glutaconic acid, aconitic acid, citraconic acid, mesaconic acid, fumaric acid, and tiglic acid.

11. The photosensitive composition of claim 1 wherein said polyalkenoic acid is a homopolymer of acrylic acid and said coupling compound is 2-isocyanatoethylmethacrylate.

\* \* \* \* \*

UNITED STATES PATENT AND TRADEMARK OFFICE
CERTIFICATE OF CORRECTION

PATENT NO. : 6,027,857
DATED : Feb. 22, 2000
INVENTOR(S) : Li et al.

It is certified that error appears in the above-identified patent and that said Letters Patent are hereby corrected as shown below:

Front page, left column, under U.S. PATENT DOCUMENTS, "4,517,218" should be --4,517,281--.

Col. 7, line 33, "Yis" should be --Y is--.

Col. 13, line 10, "ARer" should be --After--.

Signed and Sealed this

Twenty-second Day of May, 2001

*Attest:*

NICHOLAS P. GODICI

*Attesting Officer*     *Acting Director of the United States Patent and Trademark Office*